United States Patent
Kluge et al.

(10) Patent No.: US 8,041,316 B2
(45) Date of Patent: Oct. 18, 2011

(54) TRANSMISSION CIRCUIT, TRANSMISSION METHOD, AND USE

(75) Inventors: Wolfram Kluge, Dresden (DE); Tilo Ferchland, Dresden (DE); Sascha Beyer, Medingen (DE)

(73) Assignee: Atmel Corporation, San Jose, CA (US)

( * ) Notice: Subject to any disclaimer, the term of this patent is extended or adjusted under 35 U.S.C. 154(b) by 373 days.

(21) Appl. No.: 12/423,565

(22) Filed: Apr. 14, 2009

(65) Prior Publication Data

US 2009/0257527 A1    Oct. 15, 2009

Related U.S. Application Data

(60) Provisional application No. 61/044,654, filed on Apr. 14, 2008.

(30) Foreign Application Priority Data

Apr. 14, 2008    (DE) .......................... 10 2008 018 914

(51) Int. Cl.
    *H04B 1/04*    (2006.01)
(52) U.S. Cl. ..................................... 455/127.2; 455/129
(58) Field of Classification Search .................. 375/300; 455/127.1, 127.2, 127.3, 129
    See application file for complete search history.

(56) References Cited

U.S. PATENT DOCUMENTS

| | | | |
|---|---|---|---|
| 5,159,283 A * | 10/1992 | Jensen | 330/129 |
| 5,164,704 A * | 11/1992 | Steen et al. | 340/539.17 |
| 5,369,789 A * | 11/1994 | Kosugi et al. | 455/126 |
| 5,548,616 A | 8/1996 | Mucke et al. | |
| 5,563,887 A * | 10/1996 | Harasaki | 714/756 |
| 5,566,363 A * | 10/1996 | Senda | 455/126 |
| 5,752,171 A * | 5/1998 | Akiya | 455/126 |
| 6,151,667 A * | 11/2000 | Walters | 711/211 |
| 6,983,135 B1 | 1/2006 | Tsai | |
| 7,330,706 B2 | 2/2008 | Gentsch et al. | |
| 2005/0018780 A1 | 1/2005 | Kim | |
| 2007/0285170 A1 | 12/2007 | Mujtaba et al. | |

FOREIGN PATENT DOCUMENTS

EP    0 688 109 A2    12/1995

OTHER PUBLICATIONS

International Search Report and English Translation for European Patent Application 09004816.6-2411/2110954, Apr. 20, 2011.

* cited by examiner

*Primary Examiner* — Lincoln Donovan
*Assistant Examiner* — William Hernandez
(74) *Attorney, Agent, or Firm* — Baker Botts L.L.P.

(57) ABSTRACT

A method for the transmission and use of a power amplifier and transmission circuit of a radio network is provided that includes a power amplifier, which is connectable to an antenna, a counter whose output is connected to a control input of the power amplifier to output a count value to control the amplification of the power amplifier, a register for storing a register value, a comparator whose inputs are connected to the output of the counter and the register for comparing the register value with the count value, and a control circuit whose input is connected to the comparator and whose output is connected to the counter to control a counting process depending on the comparison result of the comparator.

9 Claims, 3 Drawing Sheets

TRANSMISSION CIRCUIT, TRANSMISSION METHOD, AND USE

This nonprovisional application claims priority to German Patent Application No. DE 10 2008 018 914.6, which was filed in Germany on Apr. 14, 2008, and to U.S. Provisional Application No. 61/044,654, which was filed on Apr. 14, 2008, and which are both herein incorporated by reference.

BACKGROUND OF THE INVENTION

1. Field of the Invention

The present invention relates to a transmission circuit of a radio network, to a method for transmitting a signal, and to a use.

2. Description of the Background Art

Transmission circuits of radio networks enable the transmission of data via an antenna of a radio network node. The transmission power of the node can be adjusted to set the transmission range. Examples of radio networks are described, for example, in the industry standards IEEE 802.11, IEEE 802.15.1, or IEEE 802.15.4.

SUMMARY OF THE INVENTION

It is therefore an object of the present invention to provide as improved a method for transmission as possible. Accordingly, a method for transmission in a radio network is provided. In this regard, a power amplifier can be connected to an antenna. In the method, the power amplifier is controlled by a count value assigned to a smallest amplification of the power amplifier. To this end, for example, a count value can be applied as a bit value at an x-bit wide control input.

The amplification is then increased stepwise by counting until the count value corresponds to a register value stored in a register. For this purpose, a clock signal, for example, can be applied at a binary counter. To increase the power amplifier amplification, counting up or counting down is carried out according to the design of the counter and power amplifier construction.

After the count value corresponds to the register value, data are transmitted by a transmit signal amplified by the power amplifier. To accomplish this, the transmit signal is generated, for example, by a specific modulation depending on the data.

After the data are transmitted, the amplification is reduced stepwise by counting until the count value assigned to the smallest amplification of the power amplifier is reached. To reduce the amplification of the power amplifier, counting down or counting up is carried out according to the design of the counter and power amplifier construction. Counting down is carried out, for example, when the smallest amplification is assigned, for example, the count value 0000. Counting up is carried out, for example, when the smallest amplification is assigned, for example, the count value 1111.

The object of the invention furthermore is to improve a transmission circuit as much as possible. Accordingly, a transmission circuit of a radio network is provided. The transmission circuit has a power amplifier, which is connectable to an antenna. Preferably, the transmission circuit has a power output for the connection. Moreover, the transmission circuit has a counter whose output is connected to a control input of the power amplifier to output a count value to control the amplification of the power amplifier. To this end, the output of the counter and the control input of the power amplifier preferably have a corresponding bit width of, for example, four bits. The power amplifier has a signal input and is formed to amplify a signal to be amplified and applied at the signal input depending on a control signal at the control input.

The transmission circuit can have a register for storing a register value. Preferably, the register has at least one bit width, which is greater than or equal to the bit width of the counter output.

The transmission circuit can have a comparator whose inputs are connected to the output of the counter and the register for comparing the register value with the count value.

The transmission circuit can have a control circuit whose input is connected to the comparator and whose output is connected to the counter to control a counting process depending on the comparator's comparison result.

The transmission circuit can be formed and set up to carry out the previously described process.

The invention furthermore has the object of providing a use. Accordingly, a use of a counter, a register, and a comparator is provided. The counter, register, and comparator are used for the stepwise increasing of an amplification of a power amplifier of a radio network before the transmission of data proceeding from a smallest amplification by counting by the counter until a count value of the counter reaches a register value stored in the register and for the stepwise reduction of the amplification of the power amplifier after the transmission of data by counting with the counter until a count value assigned to the smallest amplification of the power amplifier is reached.

The embodiments described hereinafter refer to both the transmission circuit and the method, as well as to the use. Accordingly, the transmission circuit can be formed and set up to carry out the process steps.

According to an embodiment, after the power amplifier is turned on before the stepwise increase of the amplification, a signal input of the power amplifier is connected to an output of a driver. Preferably, damping is continuously reduced to connect the signal output of the power amplifier to the output of the driver.

In an embodiment, the transmission circuit has a controllable damping element, which is formed for connection, particularly for continuous damping. A signal input of the power amplifier can be connected to an output of a driver via a controllable damping element. Preferably, the damping element has a controllable resistance. Preferably, the damping element has a field-effect transistor.

According to an embodiment, the damping element can be formed for continuous changing of the damping and for controlling the damping with the control circuit.

In another embodiment, it is provided that the control circuit is set up to control a counting direction and is connected to the counter to control the counting direction.

According to an embodiment, it is provided that the register is formed and connected in such a way that the register value is programmable. To this end, the transmission circuit has a connection to the register, advantageously an interface.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
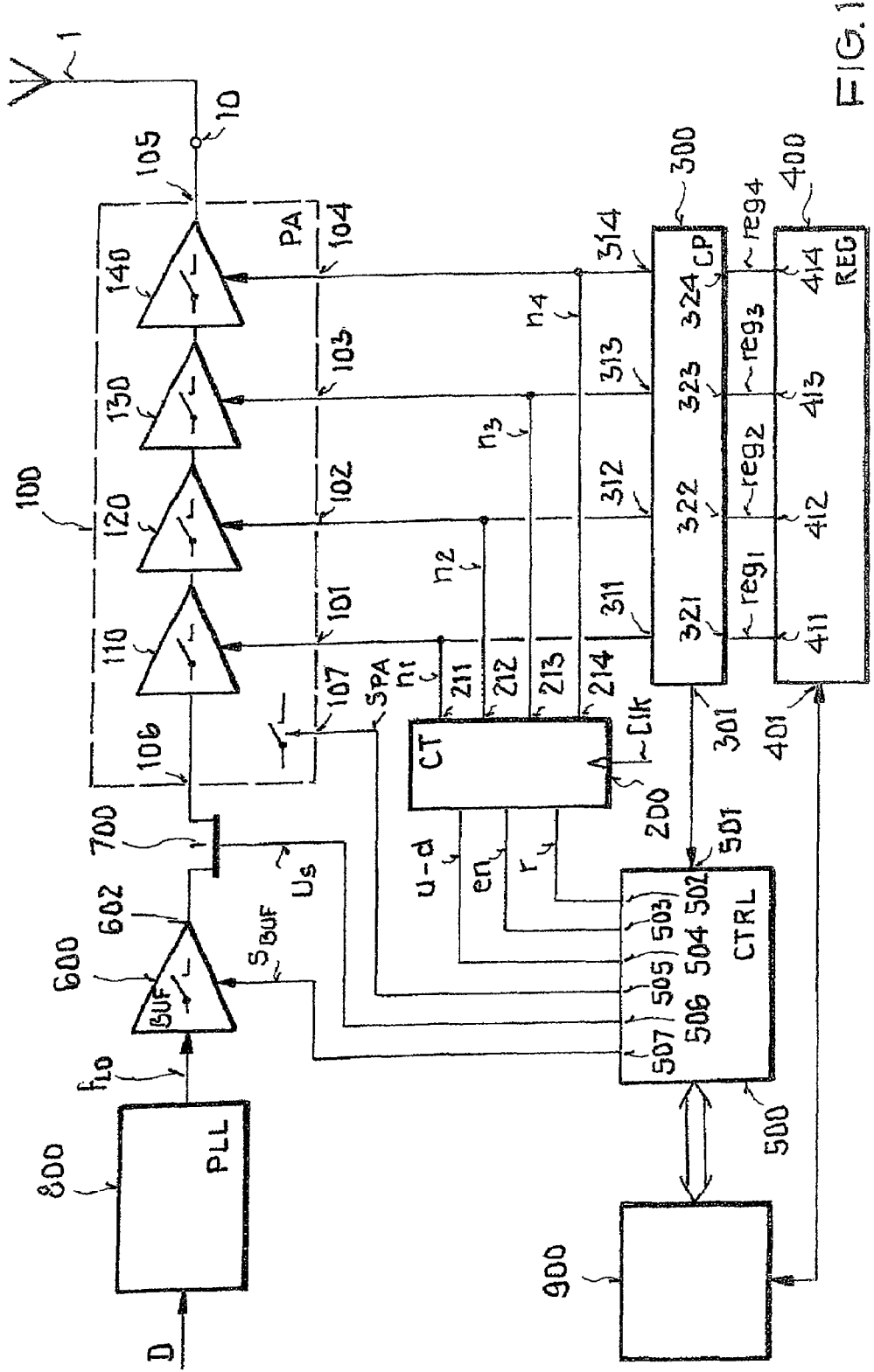
FIG. 1 is a schematic block circuit diagram of a transmission circuit.

FIG. 1 shows a schematic block circuit diagram of a transmission circuit of a radio network node. The transmission circuit has a power amplifier (PA) 100, whose power output 105 is connected to an output 10 of the transmission circuit. An antenna 1 can be connected at output 10 of the transmission circuit, which may be formed, for example, as a pad. In this case, antenna 1 is not necessarily part of the transmission circuit.

Power amplifier 100 is formed to amplify the signal to be transmitted. To set the amplification, the power amplifier has a plurality of controllable subamplifiers 110, 120, 130, 140 with the associated control lines 101, 102, 103, 104, respectively. The controllable subamplifiers 110, 120, 130, 140 are formed, for example, for a linear stepwise amplification setting. Alternatively, a nonlinear, for example, logarithmic amplification setting can also be provided. Furthermore, power amplifier 100 has yet another control input 107 for turning on or turning off the amplification of power amplifier 100.

In the exemplary embodiment of FIG. 1, a signal input 106 of power amplifier 100 is connected via a controllable damping element 700 to output 602 of a switchable driver 600 (BUF—buffer). The input of driver 600 is connected to a modulator 800, which in the exemplary embodiment of FIG. 1 is formed as a PLL (Phase Locked Loop). In the transmit mode, data D are modulated by modulator 800 and, as a modulated signal to be transmitted, reach input 106 of power amplifier 100 via driver 600 and via damping element 700 set to the lowest damping, are amplified in power amplifier 100, and output to antenna 1.

The transmission circuit of the exemplary embodiment of FIG. 1 has a counter (CT) 200, whose output lines 211, 212, 213, 214 are connected to control lines 101, 102, 103, 104, respectively, of power amplifier 100. A clock signal clk is applied at a clock input of counter 200. The amplification can be changed by counting by connecting the output of counter 200 to the control input of power amplifier 100. Furthermore, output lines 211, 212, 213, 214 are connected to input lines 311, 312, 313, 314 of a comparator (CP) 300. Additional input lines 321, 322, 323, 324 of comparator 300 are connected to output lines 411, 412, 413, 414 of a register (REG) 400. Comparator 300 is formed to compare a count value n of counter 300 with a register value reg of register 400. The count value n in this case has a bit width of four bits, n1, n2, n3, and n4. The register likewise has a bit width of four bits, reg1, reg2, reg3, and reg4.

The comparison result is output at output 301 of comparator 300 and reaches an input 501 of a control circuit 500, said input being connected to output 301. Outputs 502, 503 and 504 of control circuit 500 are connected to counter 200 to control counter 200. Control circuit 500 can output a reset signal r at output 502 to reset counter 200. Control circuit 500 can output an activation signal en (enable) at output 503 to start or stop a counting process by counter 200. Control circuit 500 can output a direction signal u-d (up-down) at output 504 to set a counting direction of counter 200. Furthermore, control circuit 500 has output 505 for turning on or turning off the amplification of power amplifier 100 by means of control signal $S_{PA}$, which is connected to a control input 107 of power amplifier 100. Furthermore, control circuit 500 has output 506 to output the control voltage $U_s$, which is connected to a control input (gate) of damping element 700, formed as an NMOS field-effect transistor, to set the damping. Furthermore, control circuit 500 has output 507 for turning driver 600 on or off by means of control signal $S_{BUF}$, which is connected to a control input of driver 600.

The transmission circuit in the exemplary embodiment of FIG. 1 has one or more interfaces to an arithmetic logic unit, for example, a microcontroller 900. The transmission circuit is programmable via interface/input 401 of register 400 in that the register value reg can be recorded in register 400 via interface 401. To program the register value reg in register 400, first a necessary amplification can be determined by measuring a field strength received in a receiving node. Then, a register value reg corresponding to a necessary amplification is stored in register 400.

Figure 2:
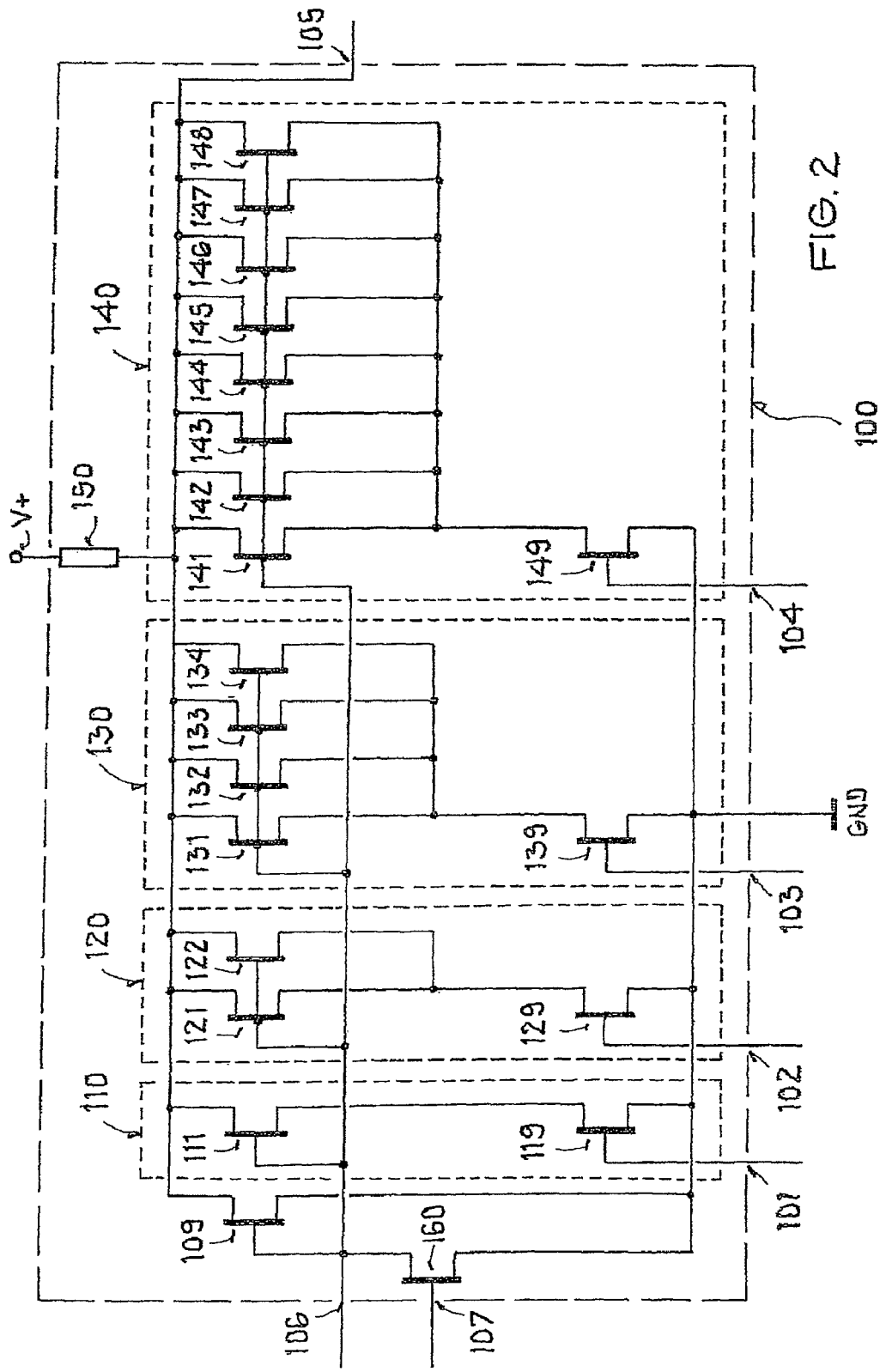
FIG. 2 is a schematic circuit diagram of a power amplifier.

A design variant of a power amplifier 100 is shown as a schematic circuit diagram in FIG. 2. All transistors 109, 111, 121, 122, 131, 132, 133, 134, 141, 142, 143, 144, 145, 146, 147, and 148 used for amplification are connected to signal input 106 and power output 105 of power amplifier 100. The smallest amplification is thereby set by transistor 109. Subamplifier 110 is assigned to transistor 111, whose source can be connected to ground GND via control transistor 119. Subamplifier 120 has two transistors 121 and 122 for amplification, whose respective source can be connected to ground GND via control transistor 129. Subamplifier 130 has four transistors 131 to 134 for amplification, whose respective source can be connected to ground GND via control transistor 139. Subamplifier 140 has eight transistors 141 to 148 for amplification, whose respective source can be connected to ground GND via control transistor 149. Transistors 109 to 148 contributing to amplification are connected parallel to one another and act on the same load 150. Load 150 is preferably formed as an inductor. Alternatively, load 150 can also be formed as a passive or active resistance or as a current source. A binary weighting is achieved by the number of transistors per subamplifier.

The control inputs of control transistors 119 to 149 are connected to control lines 101 to 104, respectively. Power output 105 is connected via load 150 to a positive supply voltage terminal V+. Signal input 106 can be short-circuited to ground GND by means of control transistor 160, to turn off the amplification of power amplifier 100.

Figure 3:
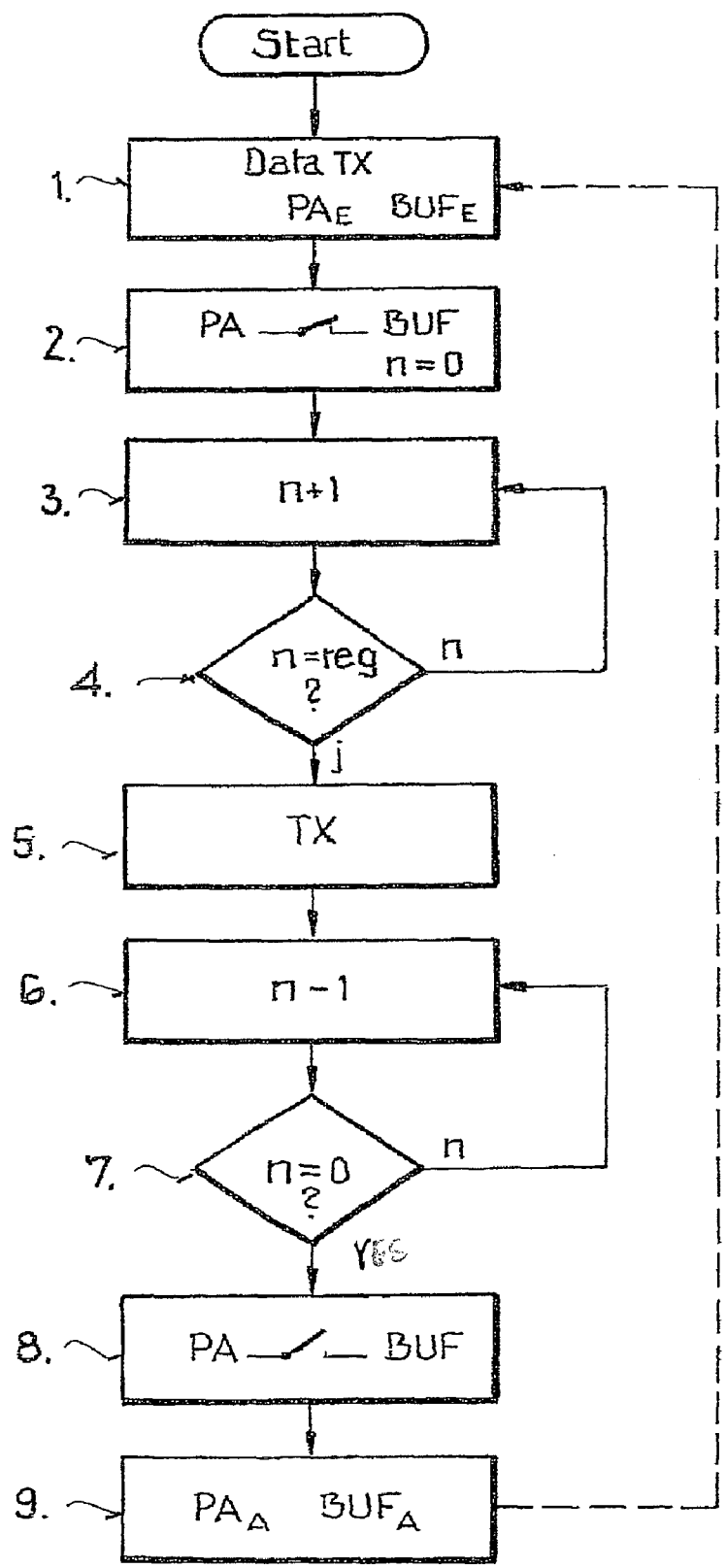
FIG. 3 is a schematic flowchart of a method.

FIG. 3 shows a diagram for the schematic depiction of a process sequence for transmitting in a radio network.

After the start, data D are available for transmission (TX) in process step 1. In this case, power amplifier 100 is set to the state "on" ($PA_E$) and driver 600 likewise to the state "on" ($BUF_E$). In step 2, power amplifier (PA) 100 is connected to driver (BUF) 600 by continuous reduction of damping via damping element 700. During the continuous reduction, the unmodulated carrier $f_{LO}$ (without data D) is applied at the input of driver 600 and thereby at input 106 of power amplifier 100. The carrier signal appears with a low power at output 10.

Power amplifier 100 is controlled by a count value assigned to a smallest amplification of power amplifier 100

$n=0$ or $n1|n2|n3|n4=0|0|0|0$ by counter 200. To this end, control circuit 500 can reset counter 200 by the reset signal r.

The amplification is then increased stepwise by counting. In step 3, to this end n is increased by one (n+1) to n=1 (0001) by clock signal clk at clock input of counter 200. In step 4, the count value n is compared with a register value reg in register 400 by comparator 300. If the count value n does not correspond to the register value reg, in step 3, the count value n is again increased by one. If the count value n corresponds to the register value reg, in step 5, a transmission (TX) of data D occurs, which are transmitted by a transmit signal amplified by power amplifier 100.

After the transmission of data D, in step 6, the count value n is reduced by one by counting down (n−1). Thus, the amplification is reduced stepwise by counting until count value n=0 assigned to the smallest amplification of power amplifier 100 is reached in step 7. Next, in step 8, the signal connection between power amplifier (PA) 100 and driver (BUF) 600 is interrupted after a continuous increase in the damping by damping element 700. Then, power amplifier 100 and driver 600 are set to the "off" state ($PA_A$, $BUF_A$). To this end, signal input 106 is short-circuited to ground GND by opening of transistor 160. If additional data D are to be transmitted, the process can be continued in step 1.

The invention is not limited to the shown embodiment variants in the figures. For example, it is possible to use a complementary circuit with PMOS field-effect transistors instead of NMOS field-effect transistors of power amplifier 100 in FIG. 2. It is also possible to connect NMOS field-effect transistors and PMOS field-effect transistors and to form the power amplifier as a push-pull stage. The functionality of the transmission circuit, according to the exemplary embodiment of FIG. 1, and of the flowchart, according to the exemplary embodiment of FIG. 3, is used especially advantageously for a radio network of the industry standard IEEE 802.15.4.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for transmitting in a radio network, the method comprising:
    controlling a power amplifier, which is connectable to an antenna, by a count value assigned to the smallest amplification of power amplifier;
    increasing the amplification stepwise by counting until the count value corresponds to a register value stored in a register;
    transmitting data by a transmit signal amplified by the power amplifier; and
    reducing, after the data are transmitted, the amplification stepwise by counting until the count value assigned to the smallest amplification of the power amplifier is reached.

2. The method according to claim 1, wherein after the power amplifier is turned on before the stepwise increase in the amplification, a signal input of the power amplifier is connected to an output of a driver.

3. The method according to claim 2, wherein a damping is continuously reduced to connect the signal input of the power amplifier to the output of the driver.

4. A transmission circuit of a radio network comprising:
    a power amplifier, which is connectable to an antenna;
    a counter whose output is connected to a control input of the power amplifier to output a count value to control the amplification of the power amplifier;
    a register for storing a register value;
    a comparator whose inputs are connected to the output of the counter and the register for comparing the register value with the count value; and
    a control circuit whose input is connected to the comparator and whose output is connected to the counter to control a counting process depending on the comparison result of the comparator.

5. The transmission circuit according to claim 4, wherein the control circuit is configured to control a counting direction and is connected to the counter.

6. The transmission circuit according to claim 4, wherein a signal input of the power amplifier is connected to an output of a driver via a controllable damping element.

7. The transmission circuit according to claim 6, wherein the damping element is configured for continuously changing a damping and for controlling the damping with the control circuit.

8. The transmission circuit according to claim 4, wherein the register value is programmable.

9. Use of a counter, a register, and a comparator for stepwise increasing of an amplification of a power amplifier of a radio network before the transmission of data proceeding from a smallest amplification by counting by the counter until a count value of the counter reaches a register value stored in the register and for the stepwise reduction of the amplification of the power amplifier after the transmission of data by counting by the counter until a count value assigned to the smallest amplification of the power amplifier is reached.

* * * * *